(12) United States Patent
Kamphuis et al.

(10) Patent No.: US 11,658,056 B2
(45) Date of Patent: May 23, 2023

(54) TECHNIQUE FOR HANDLING DICED WAFERS OF INTEGRATED CIRCUITS

(71) Applicant: NXP B.V., Eindhoven (NL)

(72) Inventors: Antonius Hendrikus Jozef Kamphuis, Lent (NL); Johannes Cobussen, Beuningen (NL)

(73) Assignee: NXP B.V., Eindhoven (NL)

( * ) Notice: Subject to any disclaimer, the term of this patent is extended or adjusted under 35 U.S.C. 154(b) by 66 days.

(21) Appl. No.: 16/843,461

(22) Filed: Apr. 8, 2020

(65) Prior Publication Data

US 2021/0134648 A1 May 6, 2021

Related U.S. Application Data

(63) Continuation-in-part of application No. 16/674,399, filed on Nov. 5, 2019.

(51) Int. Cl.
| | |
|---|---|
| *B29C 65/00* | (2006.01) |
| *H01L 21/683* | (2006.01) |
| *H01L 21/677* | (2006.01) |
| *H01L 23/00* | (2006.01) |
| *C09J 7/20* | (2018.01) |
| *B29C 65/50* | (2006.01) |

(Continued)

(52) U.S. Cl.
CPC ............ *H01L 21/6836* (2013.01); *C09J 7/20* (2018.01); *H01L 21/6779* (2013.01); *H01L 21/67763* (2013.01); *H01L 24/01* (2013.01); *B29C 65/50* (2013.01); *B29C 65/526* (2013.01); *B29C 65/565* (2013.01); *B29C 65/58* (2013.01); *H01L 21/6838* (2013.01)

(58) Field of Classification Search
CPC ....... B29C 65/50; B29C 65/565; B29C 65/58; H01L 21/6836; H01L 21/6838; B32B 37/1292

See application file for complete search history.

(56) References Cited

U.S. PATENT DOCUMENTS

| | | | | |
|---|---|---|---|---|
| 4,140,260 A | * | 2/1979 | Gantley | .............. H01L 21/6836 |
| | | | | 225/93 |
| 5,310,104 A | * | 5/1994 | Zaidel | .................. B28D 5/0052 |
| | | | | 225/2 |

(Continued)

FOREIGN PATENT DOCUMENTS

| | | |
|---|---|---|
| CN | 101887841 A | 11/2010 |
| CN | 102206469 A | 10/2011 |
| TW | 201604943 A | 2/2016 |

OTHER PUBLICATIONS

"Semi G74-0699 Specification for Tape Frame for 300 mm Wafers," Jun. 1998, pp. 1-3, Semi.

(Continued)

*Primary Examiner* — Philip C Tucker
*Assistant Examiner* — Nickolas R Harm

(57) ABSTRACT

A technique for handling an integrated circuit tape assembly having a plurality of integrated circuits supported by underlying dicing tape involves placing the integrated circuit tape assembly on a film frame carrier (FFC) frame, stretching the dicing tape while on the FFC frame, and securing the stretched dicing tape by engaging a spring ring with the dicing tape and FFC frame. Adjacent integrated circuits are thereby inhibited from colliding during shipment or storage for subsequent processing.

11 Claims, 18 Drawing Sheets

(51) Int. Cl.
  *B29C 65/52* (2006.01)
  *B29C 65/58* (2006.01)
  *B29C 65/56* (2006.01)

(56) References Cited

U.S. PATENT DOCUMENTS

| | | | | |
|---|---|---|---|---|
| 5,809,624 | A * | 9/1998 | Nakamae | G03B 21/56 |
| | | | | 26/88 |
| 2008/0032489 | A1* | 2/2008 | Formosa | H01L 21/6836 |
| | | | | 438/464 |
| 2008/0105383 | A1* | 5/2008 | Kubo | H01L 21/67132 |
| | | | | 156/494 |
| 2009/0061596 | A1* | 3/2009 | Takahashi | B28D 5/0011 |
| | | | | 438/460 |
| 2014/0339673 | A1* | 11/2014 | Shoichi | H01L 21/6836 |
| | | | | 438/464 |
| 2018/0033665 | A1* | 2/2018 | Niederhofer | H01L 21/67781 |
| 2018/0308711 | A1* | 10/2018 | Obata | H01L 21/4857 |
| 2020/0027772 | A1* | 1/2020 | Sherbin | H01L 21/6836 |
| 2020/0083076 | A1* | 3/2020 | Esteron | B65D 85/30 |

OTHER PUBLICATIONS

U.S. Appl. No. 16/674,399, filed Nov. 5, 2019, entitled "Technique for Handling Diced Wafers of Integrated Circuits".

* cited by examiner

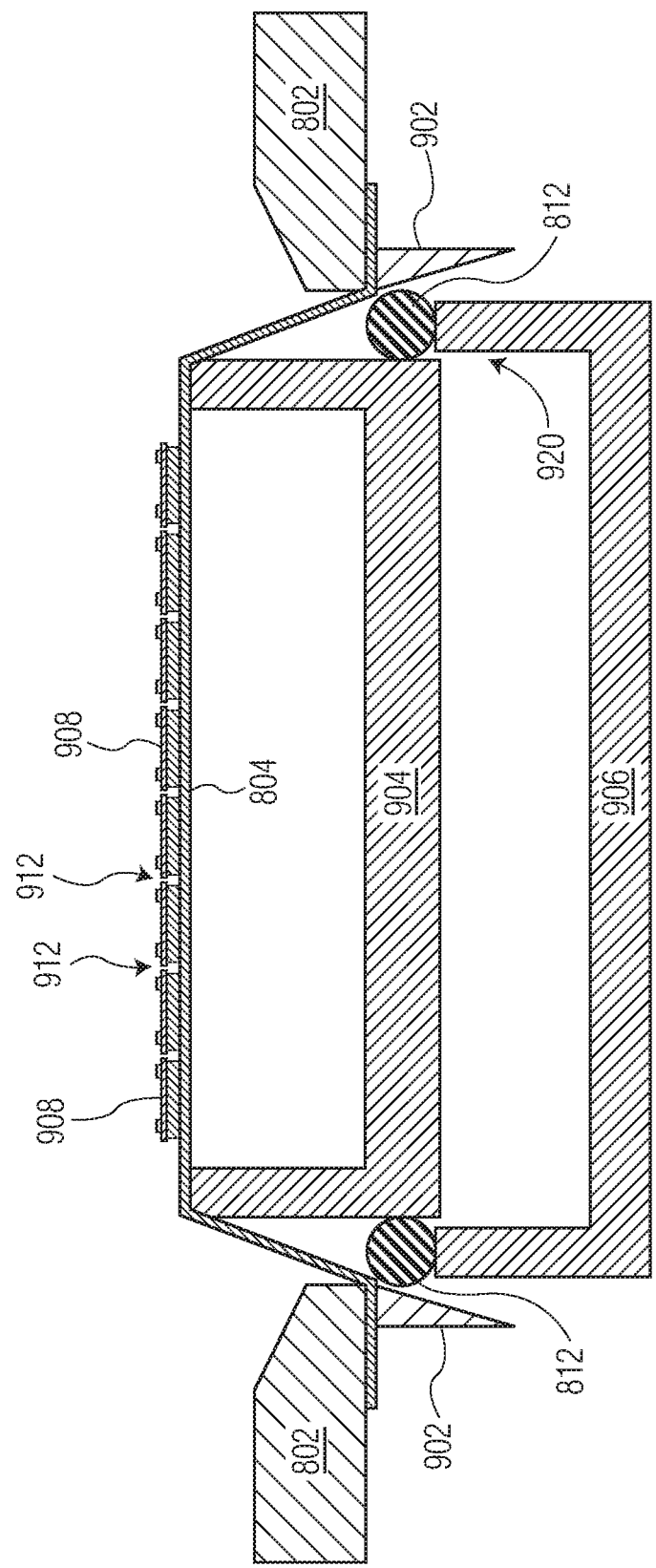

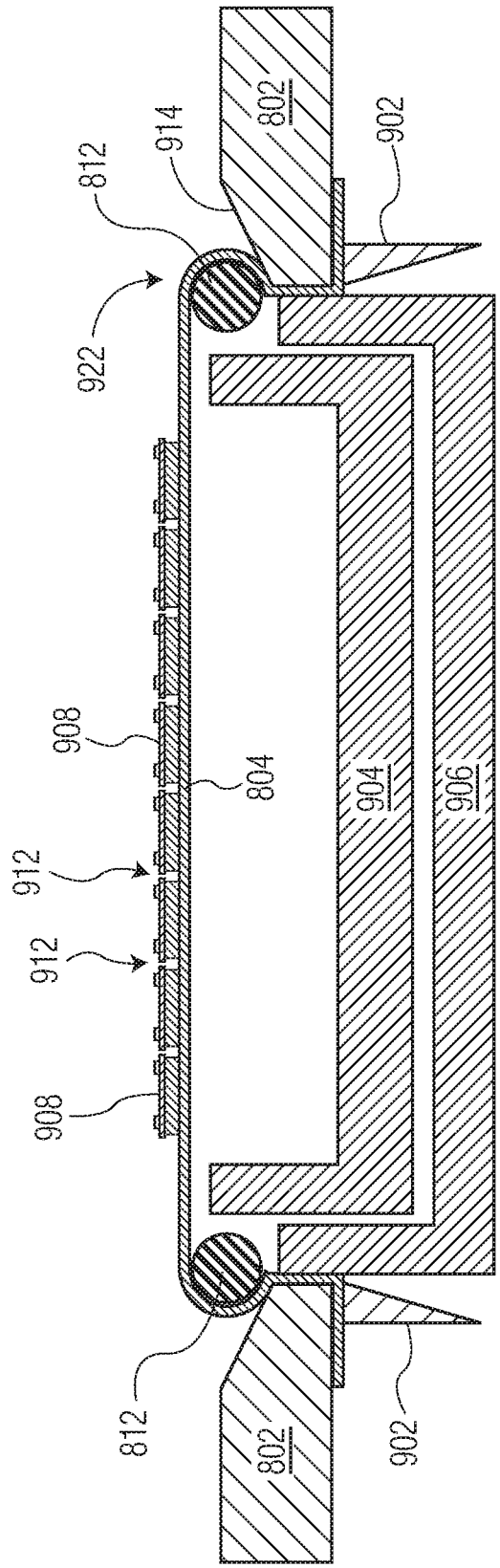

TECHNIQUE FOR HANDLING DICED WAFERS OF INTEGRATED CIRCUITS

BACKGROUND

Field of the Invention

The present invention relates to integrated circuits and, more specifically but not exclusively, to techniques for handling diced wafers of integrated circuits for storage and shipping.

Description of the Related Art

This section introduces aspects that may help facilitate a better understanding of the disclosure. Accordingly, the statements of this section are to be read in this light and are not to be understood as admissions about what is prior art or what is not prior art.

In integrated circuit (IC) fabrication, it is known to form many instances of an integrated circuit on a single substrate wafer and subsequently separate those instances for packaging into individual packaged IC devices. In certain IC fabrication techniques, after the integrated circuits are formed on the wafer, dicing tape is applied to one surface of the wafer, and plasma dicing is applied to the other side of the wafer to remove most, but not all, of the substrate material holding the different instances of the integrated surface together. The remaining substrate material, referred to as saw bows, are thin lengths of substrate material linking adjacent integrated circuits together. The diced wafer/tape assembly is then secured within a film frame carrier (FFC) that allows stretching of the dicing tape and thereby the wafer in all directions within the plane of the wafer, causing the saw bows to break and establishing physical separation between adjacent integrated circuits. This stretching of the dicing tape needs to be fixed/secured. The assembly, which now consists of the dicing tape supporting the many separated integrated circuits and secured within the FFC, can be stored and/or shipped for subsequent processing (i.e., packaging the individual integrated circuits) without risking damage to the integrated circuits as a result of adjacent integrated circuits colliding with one another during movement of the assembly.

FIG. 1 is a plan view of a conventional single-piece FFC frame 100 having a circular opening 102. The FFC frame 100, which can be made of either metal or plastic, can hold the dicing tape, but cannot be used to stretch the dicing tape and fix the stretch on its own.

FIG. 2A is a cross-sectional side view showing a diced wafer/tape assembly 210 having integrated circuits 212 interconnected by saw bows 214 and supported by dicing tape 216. As shown in FIG. 2A, an FFC outer ring 220 and the FFC frame 100 of FIG. 1 are positioned above the assembly 210 with an FFC inner ring 230 positioned below. The FFC outer and inner grip rings 220 and 230 form a grip ring set that enables the dicing tape 216 to be stretched and secured between the two rings, after which the FFC frame 100 can be cut off from the assembly. As represented in FIG. 2A, the inner diameter of the FFC outer ring 220 and the circular opening 102 in the FFC frame 100 are both slightly larger than the outer diameter of the FFC inner ring 230. Note that the dicing tape 216 extends laterally beyond the integrated circuits 212 such that at least some of the bottom surface of the FFC frame 100 rests on the periphery of dicing tape 216. To secure the assembly 210 within the FFC frame 100, the FFC inner ring 230 is pushed through the circular opening 102 of the FFC frame 100 and into the FFC outer ring 220, e.g., using an excentre press (not shown).

FIG. 2B is a cross-sectional side view of the configuration of FIG. 2A after the FFC inner ring 230 has been pushed into the FFC outer ring 220. As the FFC inner ring 230 is pushed through the circular opening 102 of the FFC frame 100 and into the FFC outer ring 220, the tight fit between those components ensures that the dicing tape 216 gets stretched laterally, thereby causing the saw bows 214 of FIG. 2A to break and leaving gaps 215 between adjacent integrated circuits 212 in the resulting integrated circuit/tape assembly 240, which is now secured to the FFC frame 100 as assembly 250 for further handling (e.g., storage and/or shipping).

FIG. 2C is a cross-sectional side view of three instances of the assembly 250 of FIG. 2B stacked on top of one another for storage and/or shipping.

One of the problems with the conventional FFC of FIGS. 1-2 is that the height of the resulting assemblies 250 is undesirably large. In typical implementations, the height of the conventional assembly 250 of FIG. 2B is about 3.5 mm. As such, the assembly 250 takes up a considerable volume of space for shipping and storage. Furthermore, the grip rings 220 and 230 are expensive compared to the cost of the FFC frame 100.

FIG. 2D is a cross-sectional side view of an assembly 260 after (i) the dicing tape 216 of FIG. 3B has been cut at the interface between the FFC frame 100 and the two concentric rings 220 and 230 and (ii) the FFC frame 100 has been removed. These steps are performed after shipping and/or storage just before the assembly 260 is placed into a die bonder. This technique is not preferred for high-density wafers and/or for wafers having a diameter of 300 mm or larger.

BRIEF DESCRIPTION OF THE DRAWINGS

Embodiments of the disclosure will become more fully apparent from the following detailed description, the appended claims, and the accompanying drawings in which like reference numerals identify similar or identical elements.

FIG. 4B is a cross-sectional side view corresponding to the view of FIG. 4A after the top and bottom FFC frames have been mated together with a diced wafer/tape assembly, similar to the assembly of FIG. 2A, positioned in between;

FIG. 4C is a cross-sectional side view of the top and bottom FFC frames of FIGS. 4A and 4B mated together with the integrated circuit/tape assembly of FIG. 2B positioned in between;

FIG. 9A through FIG. 9D illustrate, in simplified cross-sectional side views, example stages of engaging the spring ring with the FFC in accordance with an embodiment.

DETAILED DESCRIPTION

Generally, there is provided, techniques and apparatus for retaining an integrated circuit tape assembly. In an embodiment, an FFC includes the integrated circuit tap assemble affixed to an FFC frame. An expansion tool stretches the tape of integrated circuit tape assembly such that physical separation is formed between adjacent integrated circuits. While the tape is stretched, a pusher tool pushes a spring ring into a securing position such that the stretched integrated circuit tape assembly is secured. Once the stretched integrated circuit tape assembly is secured by way of the spring ring, the FFC can be safely handled and transported.

Detailed illustrative embodiments of the present disclosure are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functions/acts involved.

Figure 3A:
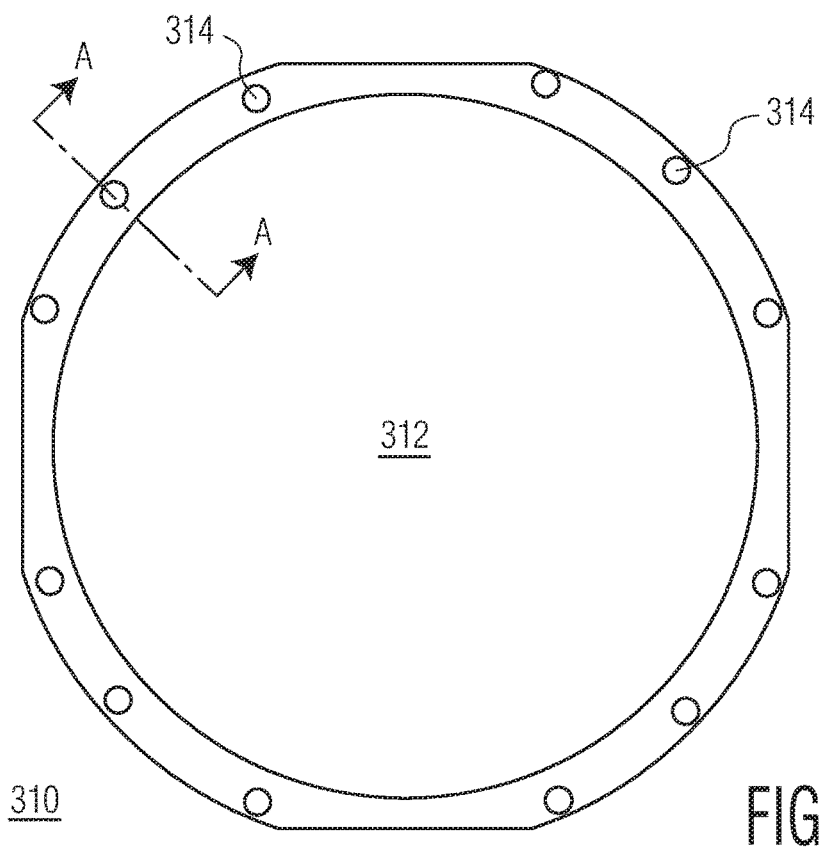
FIGS. 3A and 3B show respective plan views of a top FFC frame and a bottom FFC frame of a film frame carrier according to one embodiment of this disclosure.
Figure 3B:
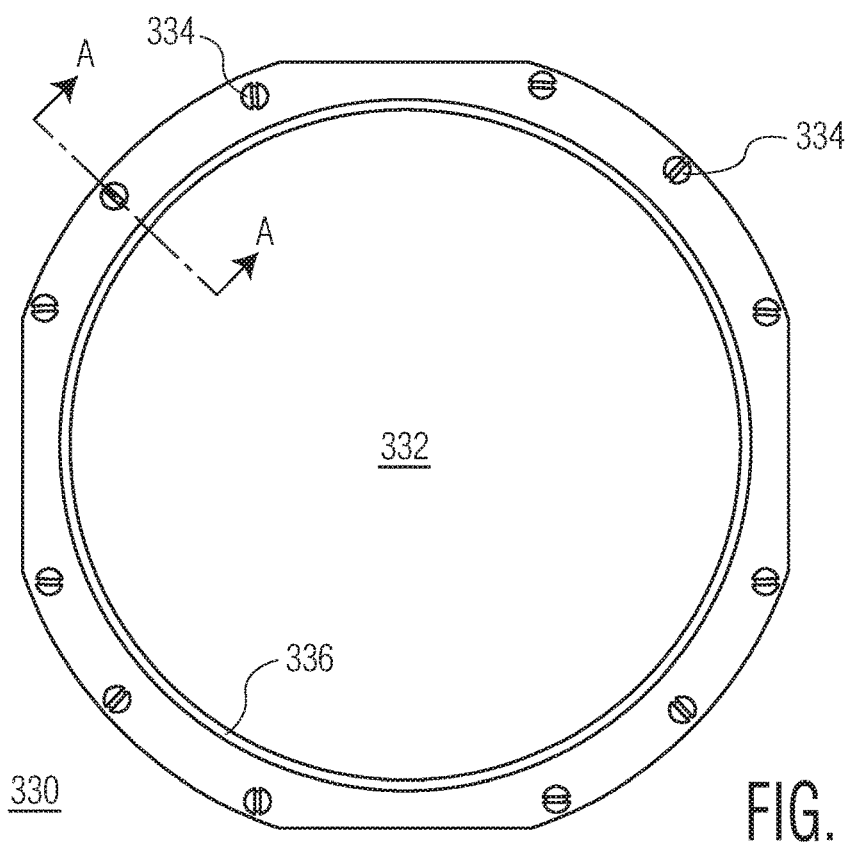

FIGS. 3A and 3B show respective plan views of a top FFC frame 310 and a bottom FFC frame 330 of a film frame carrier according to one embodiment of this disclosure. As represented in FIGS. 3A and 3B and as explained further below, the bottom FFC frame 330 has a number of barbed pegs 334 located around its periphery, and the top FFC frame 310 has a corresponding number of corresponding peg holes 314 located around its periphery. In addition, each FFC frame 310/330 has a corresponding circular opening 312/332, and the bottom FFC frame 330 has a circular inner rim 336.

Figure 4A:
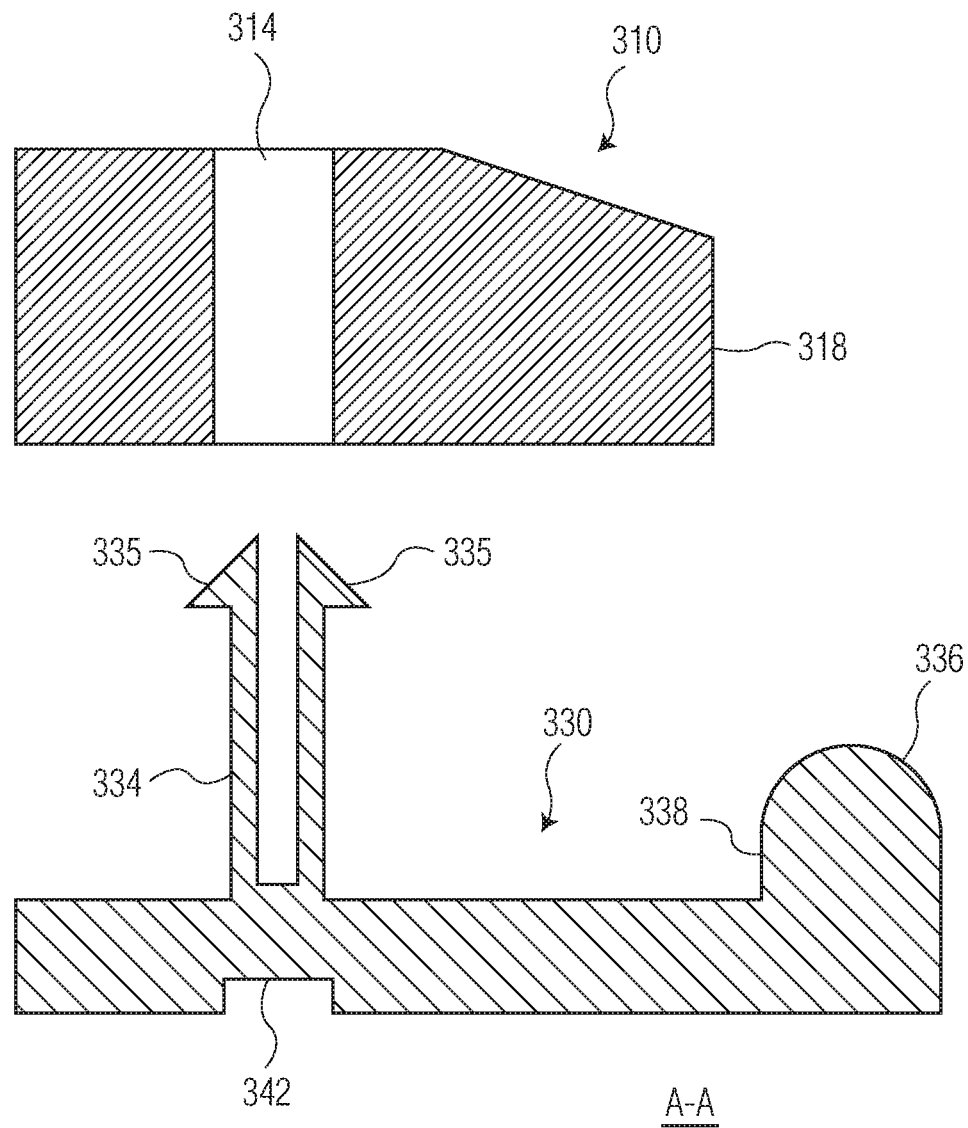
FIG. 4A is a cross-sectional side view along the cut lines A-A of FIGS. 3A and 3B of the top FFC frame positioned above the bottom FFC frame.

FIG. 4A is a cross-sectional side view along the cut lines A-A of FIGS. 3A and 3B of the top FFC frame 310 positioned above the bottom FFC frame 330. As shown in FIG. 4A, the barbed peg 334 of the bottom FFC frame 330 is aligned with the peg hole 314 of the top FFC frame 310. The barbed peg 334 has two opposing barbed tines 315 that deflect inward within the peg hole 314 as the top and bottom FFC frames are mated together. The bottom FFC frame 330 also has the circular inner rim 336 that helps to align the two FFC frames as they are mated together. Note that the diameter of the circular opening 332 of the top FFC frame 310 is slightly larger than the outer diameter of the rim 336 of the bottom FFC frame 330 such that there will be a gap between the inner surface 318 of the top FFC frame 310 and the outer surface 338 of the rim 336 of the bottom FFC frame 330 when the two frames are mated together.

Figure 1:
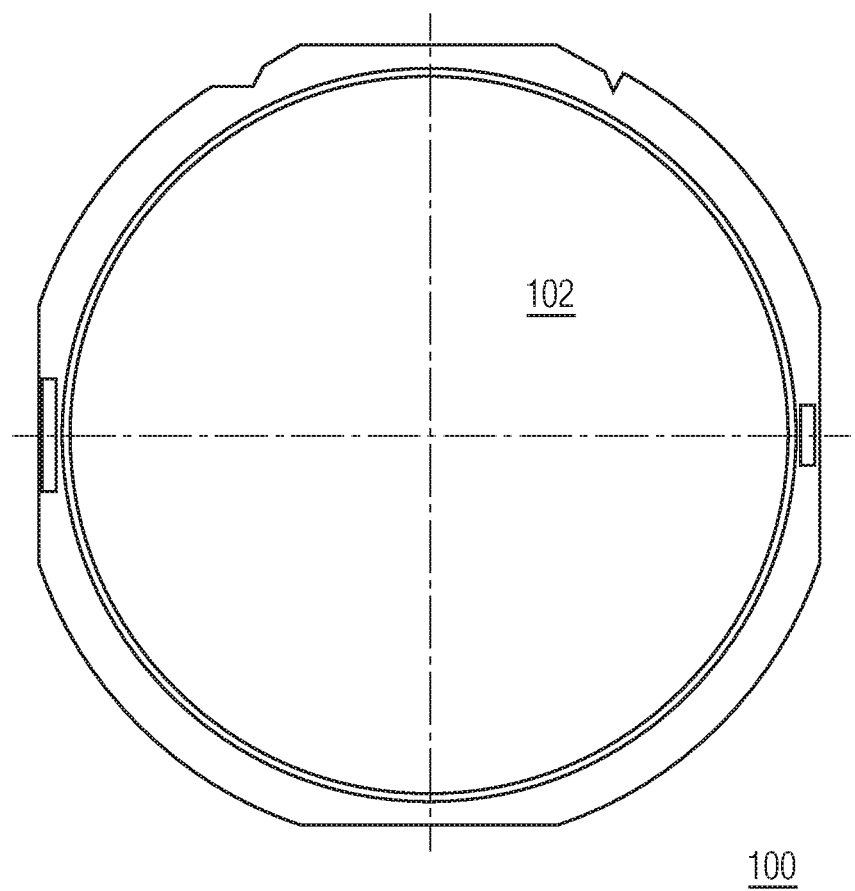
FIG. 1 is a plan view of a conventional single-piece FFC frame.
Figure 2A:
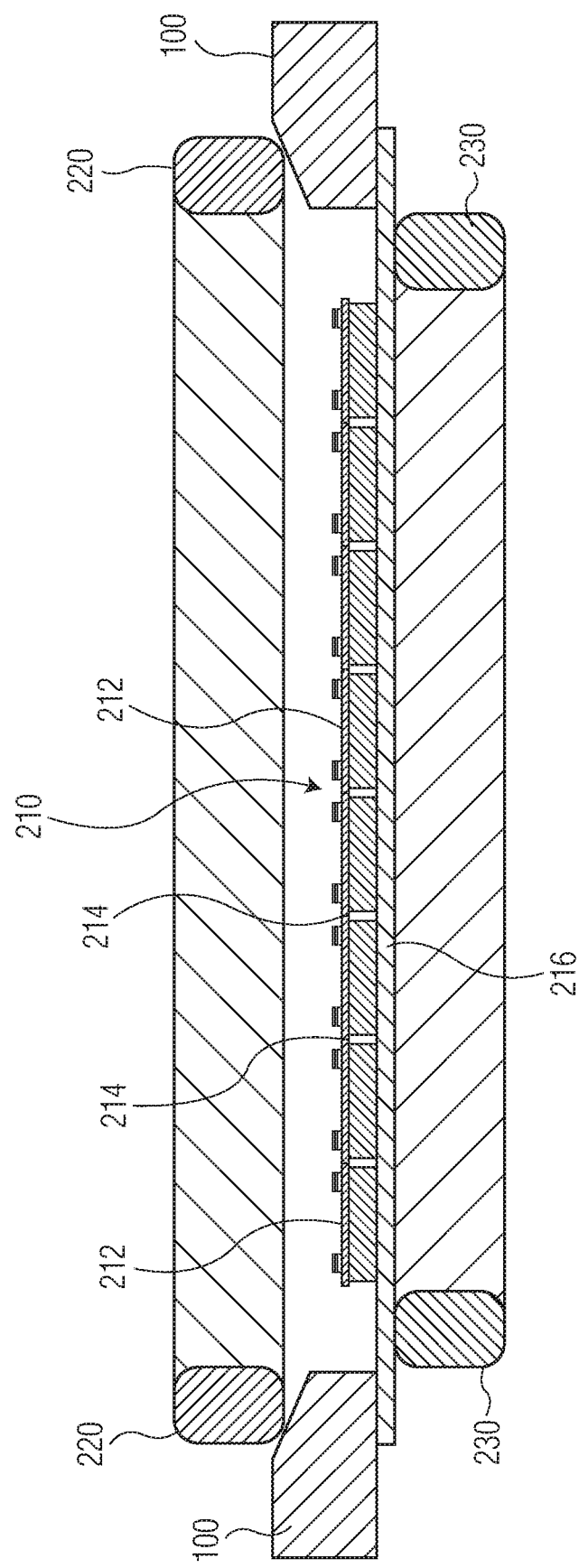
FIG. 2A is a cross-sectional side view showing a diced wafer/tape assembly with an FFC outer ring and the FFC frame of FIG. 1 positioned above the assembly and with an FFC inner ring positioned below.
Figure 4B:
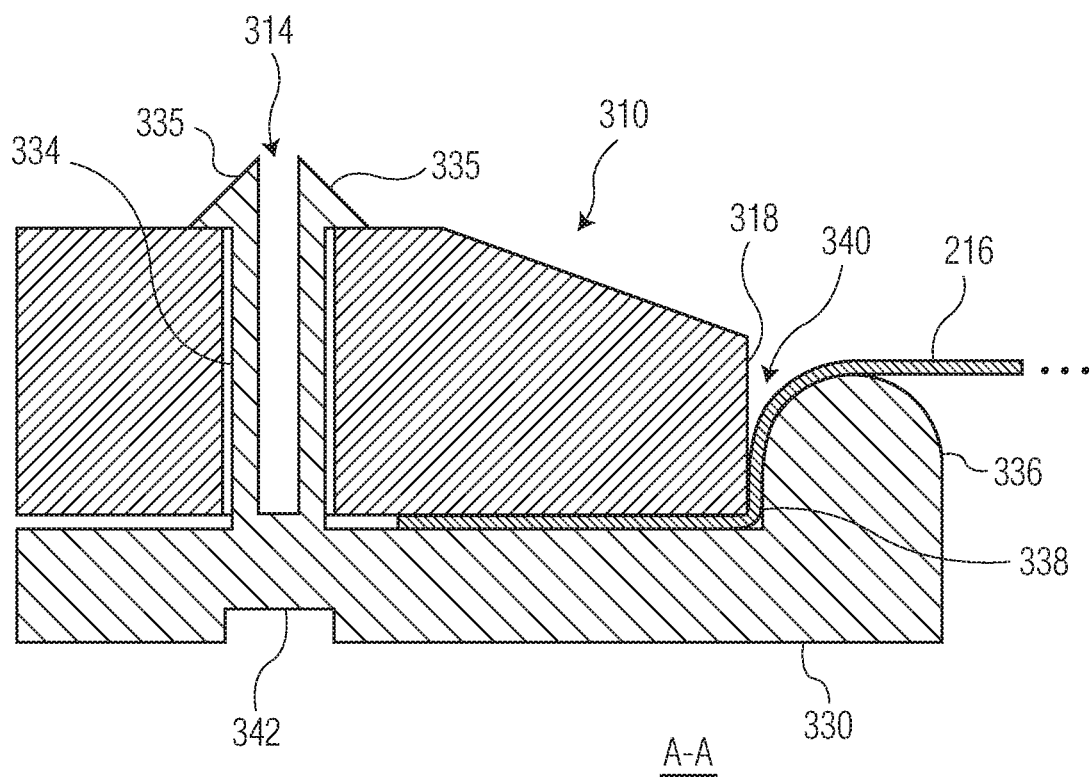

FIG. 4B is a cross-sectional side view corresponding to the view of FIG. 4A after the top and bottom FFC frames 310 and 330 have been mated together with a diced wafer/tape assembly, similar to the assembly 210 of FIG. 2A, positioned in between, where only the dicing tape 216 of the assembly 210 is represented in FIG. 4B. The ellipses ( . . . ) indicate that the rest of the assembly 210/240 is to the right in the view of FIG. 4B. FIG. 4B shows the barbed peg 334 of the bottom FFC frame 330 fully engaged within the peg hole 314 of the top FFC frame 310 with the barbed tines 315 keeping the two FFC frames mated together. FIG. 4B also shows the gap 340 between the inner surface 318 of the top FFC frame 310 and the outer surface 338 of the rim 336 of the bottom FFC frame 330. As the two FFC frames 310 and 330 are mated together with the assembly 210 in between them, the dicing tape 216 is pulled over the rim 336 of the bottom FFC frame 330, thereby stretching the dicing tape 216 laterally in all directions causing the saw bows 214 of the assembly 210 to break and establishing the gaps 215 of FIG. 2B between the integrated circuits 212. The mated FFC frames with the intervening integrated circuit/tape assembly can then be handled for storage and/or shipping for subsequent processing.

Figure 2B:
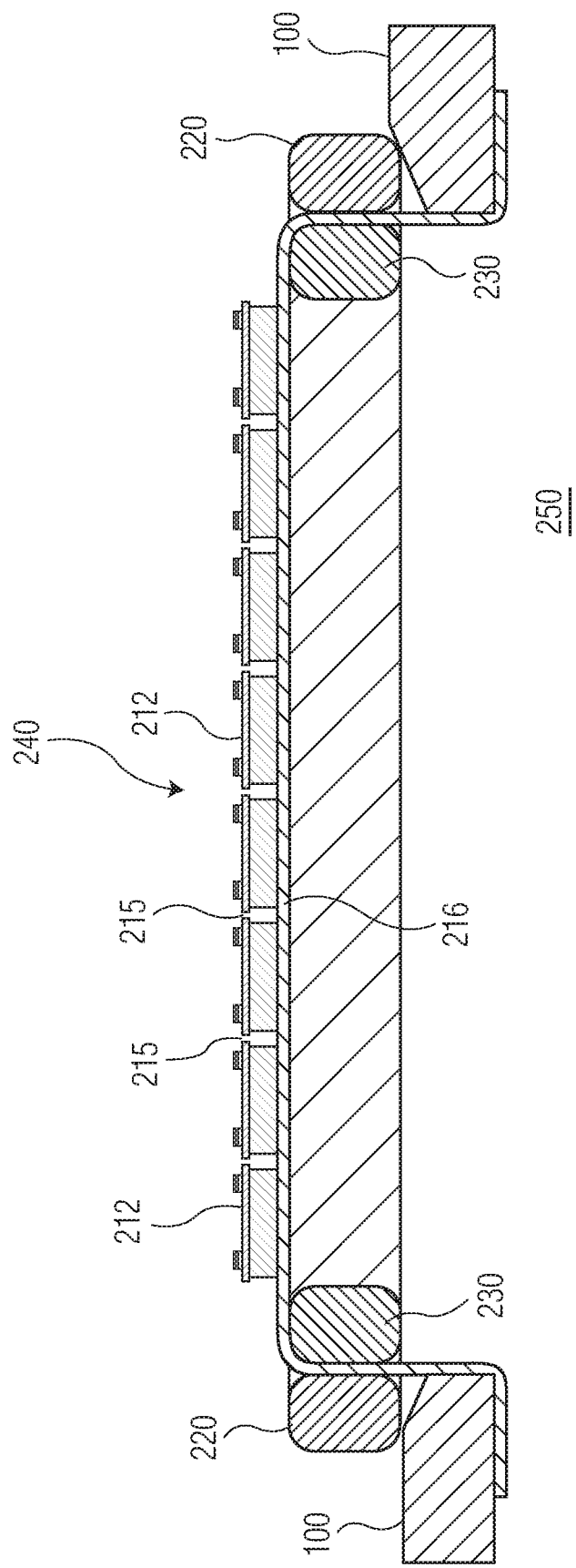
FIG. 2B is a cross-sectional side view of the configuration of FIG. 2A after the FFC inner ring has been pushed into the FFC outer ring.
Figure 2C:
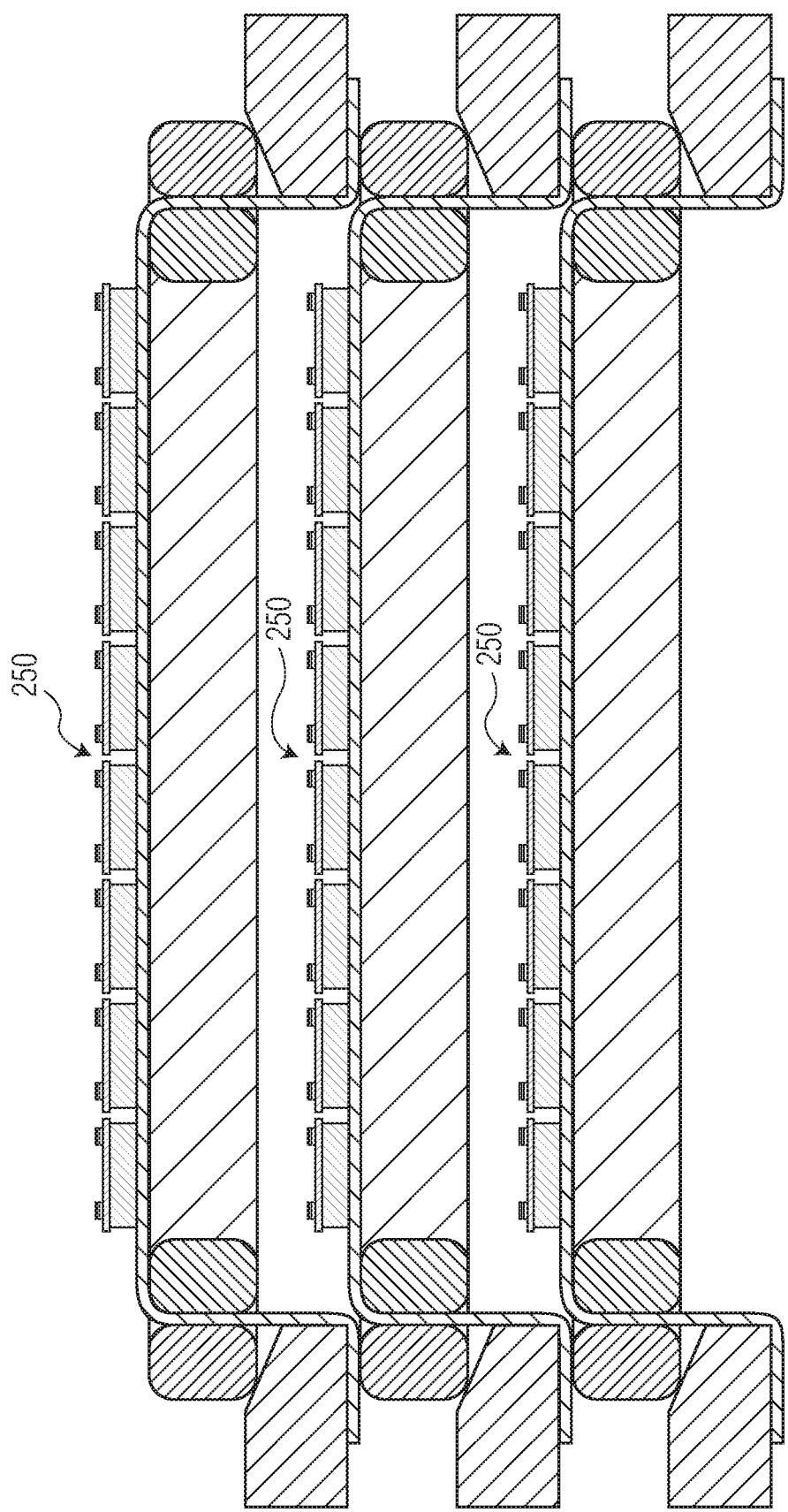
FIG. 2C is a cross-sectional side view of three instances of the assembly of FIG. 2B stacked on top of one another for storage and/or shipping.
Figure 2D:
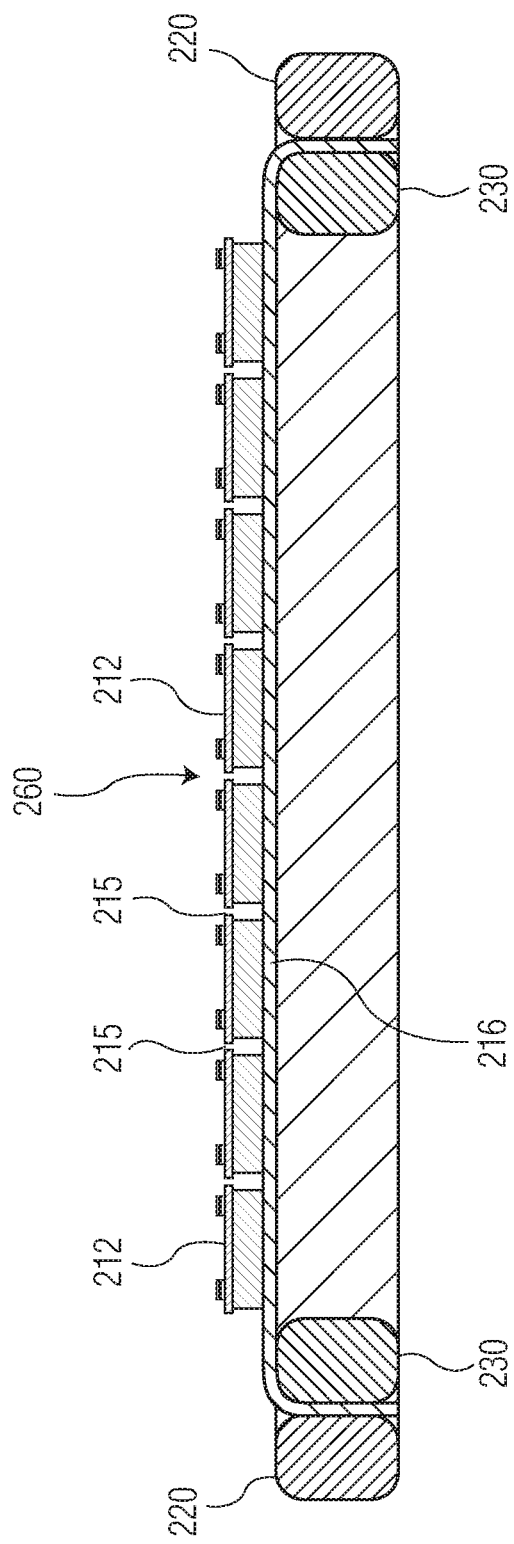
FIG. 2D is a cross-sectional side view of the assembly of FIG. 2B after (i) the dicing tape has been cut at the interface between the FFC frame and the two concentric rings and (ii) the FFC frame has been removed.
Figure 4C:
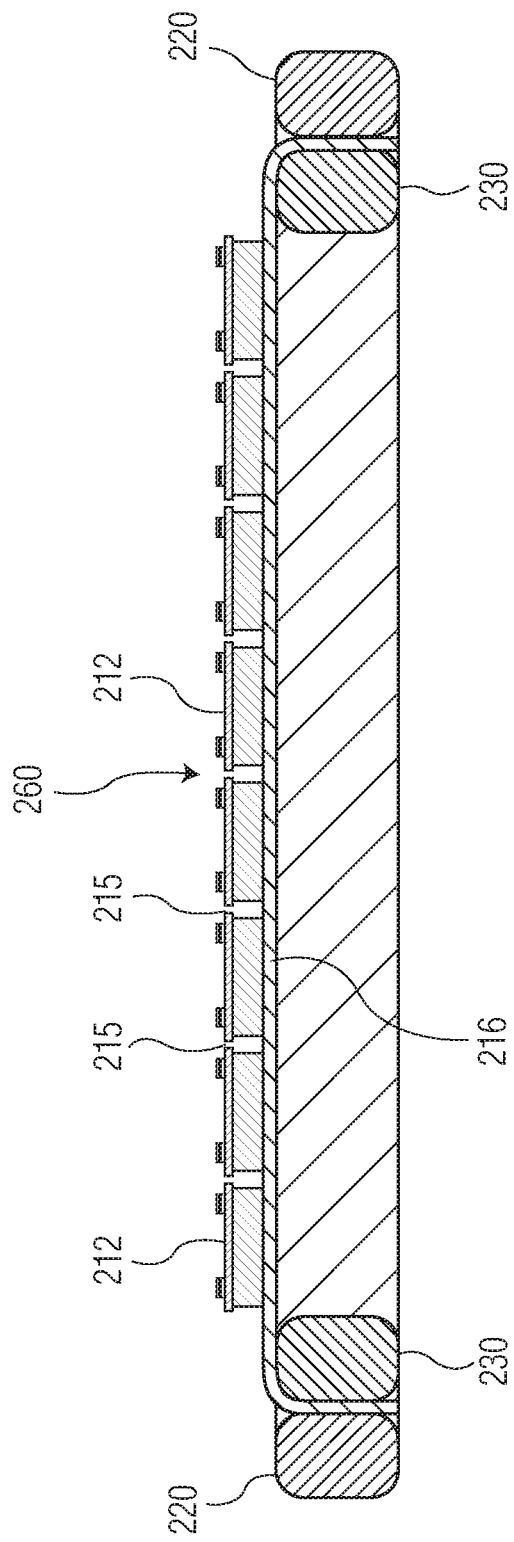

FIG. 4C is a cross-sectional side view of the top and bottom FFC frames 310 and 330 mated together with the integrated circuit/tape assembly 240 of FIG. 2B positioned in between.

As shown in FIGS. 4A-4C, the bottom FFC frame 330 can have an optional recess 342 that enables multiple instances of the assembly of FIG. 4B to be stacked on top of one another for shipment and/or storage.

Figure 5:
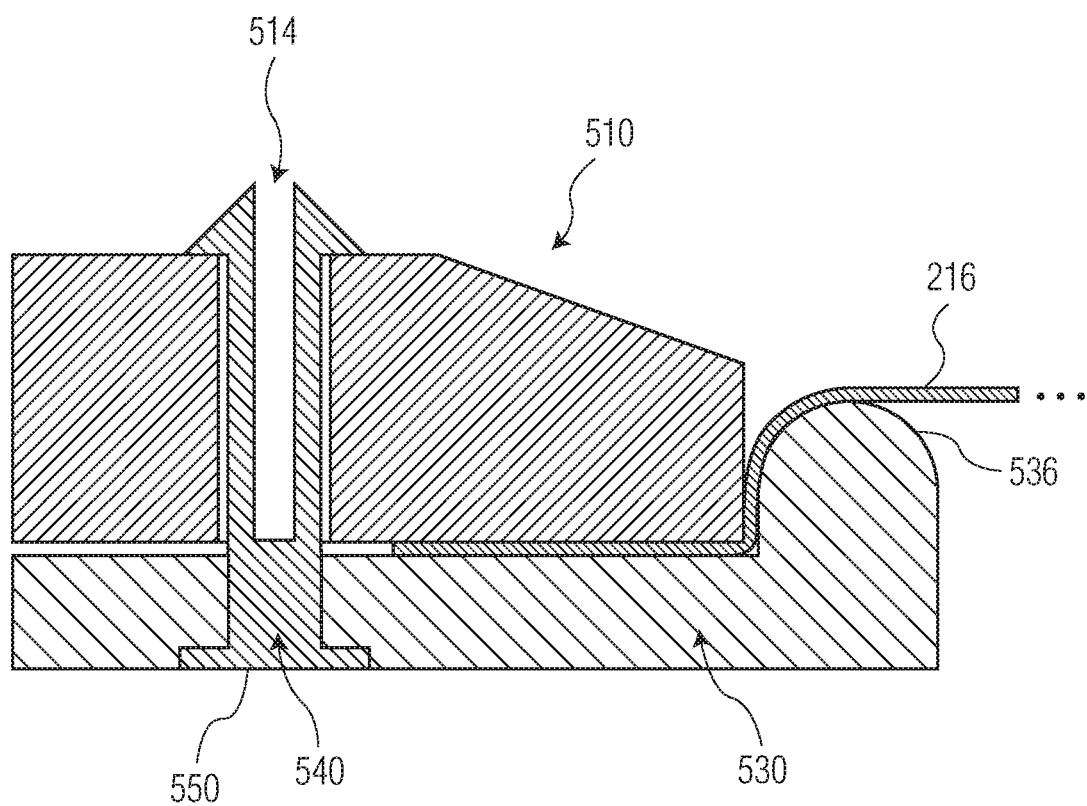
FIG. 5 is a cross-sectional side view of a top FFC frame mated to a bottom FFC frame stretching the dicing tape of an intervening diced wafer/tape assembly, according to another embodiment of the disclosure.

FIG. 5 is a cross-sectional side view of a top FFC frame 510 mated to a bottom FFC frame 530 stretching the dicing tape 216 of an intervening assembly 210/240, according to another embodiment of the disclosure. Unlike the bottom FFC frame 330 of FIGS. 3A and 4A-4C in which the barbed pegs 334 are integral to the bottom FFC frame, in the embodiment of FIG. 5, the barbed pegs 550 are separate elements that are inserted through a hole 540 in the bottom FFC frame 530 and then through a corresponding hole 514 in the top FFC frame 510. Note that the top FFC frame 510 may be identical to the top FFC frame 310 of FIGS. 3B and 4A-4C and that the bottom FFC frame 530 has a rim 536 that is similar to the rim 336 of the bottom FFC frame 330 of FIGS. 3A and 4A-4C. The ellipses ( . . . ) indicate that the rest of the assembly 210/240 is to the right in the view of FIG. 5.

Figure 6:
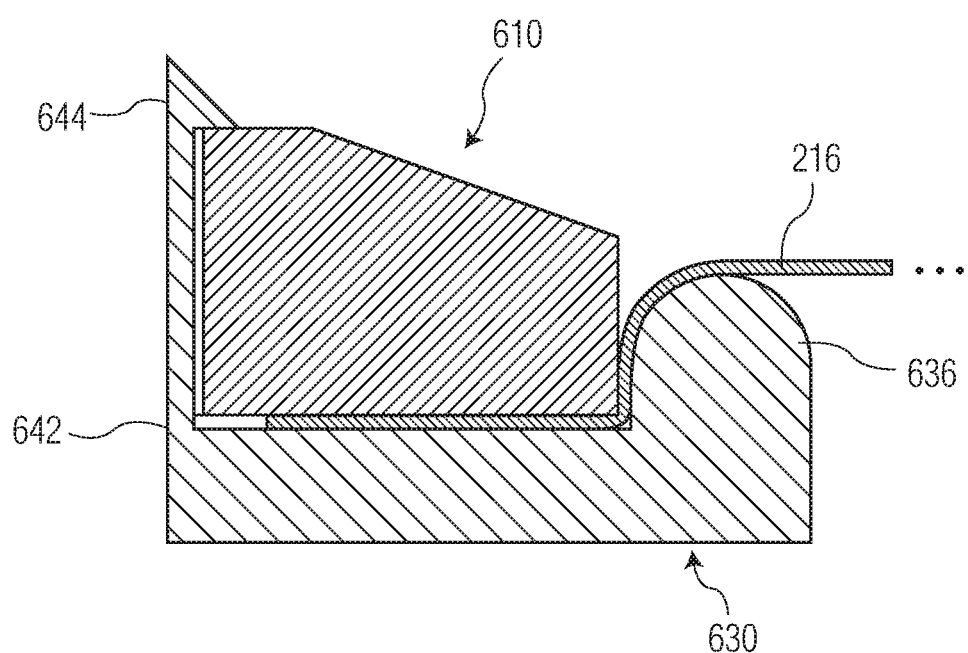
FIG. 6 is a cross-sectional side view of a top FFC frame mated to a bottom FFC frame stretching the dicing tape of an intervening diced wafer/tape assembly, according to yet another embodiment of the disclosure.

FIG. 6 is a cross-sectional side view of a top FFC frame 610 mated to a bottom FFC frame 630 stretching the dicing tape 216 of an intervening assembly 210/240, according to yet another embodiment of the disclosure. In this embodiment, the top FFC frame 610 does not need to have any peripheral holes analogous to the holes 314 and 514 of the previous embodiments. Instead, the bottom FFC frame 630 has an outer barbed structure 642 having a barbed top 644 that engages the outer diameter of the top FFC frame 610 and keeps the mated FFC frames 610 and 630 together. Here, too, the bottom FFC frame 630 has a rim 636 that is similar to the rims 336 and 536 of the previous embodiments. The ellipses ( . . . ) indicate that the rest of the assembly 210/240 is to the right in the view of FIG. 6.

Figure 7A:
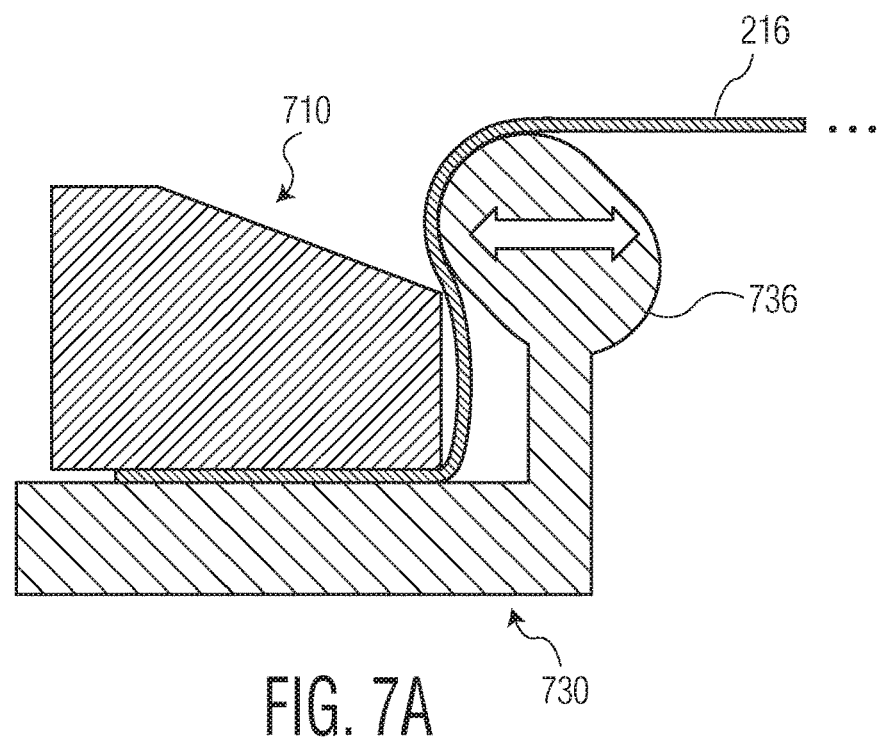
FIG. 7A is a cross-sectional side view of a top FFC frame mated to a bottom FFC frame stretching the dicing tape of an intervening diced wafer/tape assembly, according to yet another embodiment of the disclosure.

FIG. 7A is a cross-sectional side view of a top FFC frame 710 mated to a bottom FFC frame 730 stretching the dicing tape 216 of an intervening assembly 210/240, according to yet another embodiment of the disclosure. In this embodiment, instead of a rim as in the previous embodiments, the bottom FFC frame 730 has a number of flexible pegs 736 located around the inner edge of the frame that perform the dual function of stretching the dicing tape 216 and securing the two FFC frames 710 and 730 together. The arrow in FIG. 7A indicates the direction that the flexible peg 736 bends as the two FFC frames are mated together. The ellipses ( . . . ) indicate that the rest of the assembly 210/240 is to the right in the view of FIG. 7A.

Figure 7B:
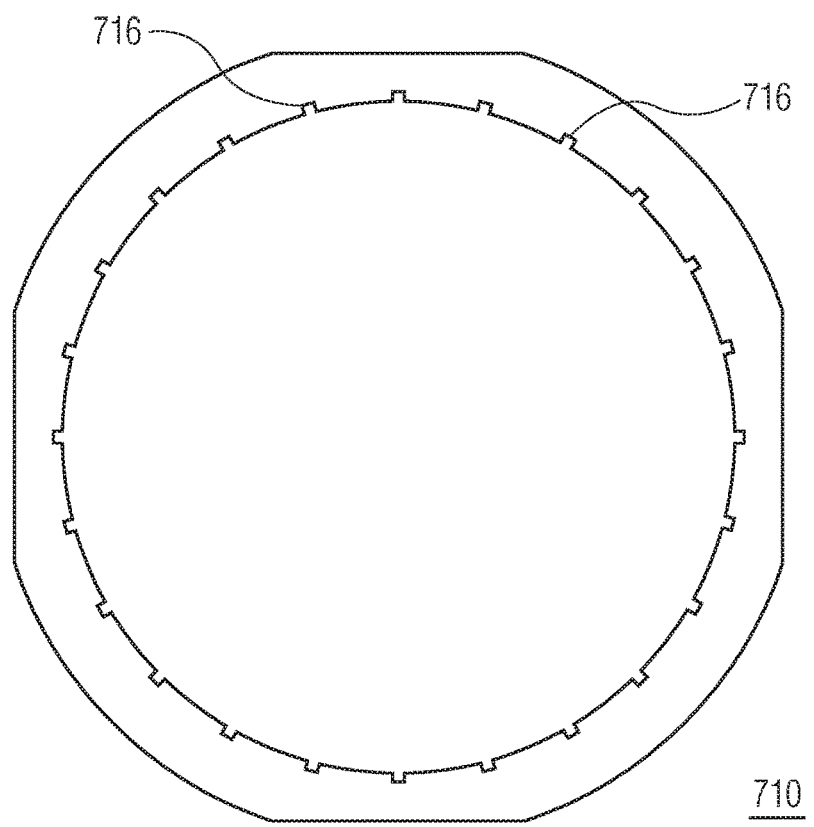
FIG. 7B is a plan view of the top FFC frame of FIG. 7A.

FIG. 7B is a plan view of the top FFC frame 710 of FIG. 7A. As shown in FIG. 7B, the top FFC frame 710 has a number of notches 716 located around the inner edge of the frame and corresponding to the locations of the flexible pegs 736 of the bottom FFC frame 730, where the notches 716 receive the flexible pegs 736 to support the mating of the frames together.

In certain embodiments, the FFC top frames 310, 510, and 610, the FFC bottom frames 330, 530, and 630, and the barbed pegs 550 are made of suitable types of plastic and formed by injection molding.

In certain implementations, the height of an FFC of the present disclosure, as dictated by the height of the corresponding structures 334, 550, 642, or 736, is about 3 mm. In this way, the height of the two pieces of FFCs of the present disclosure can be substantially equal to the height of the prior-art FFC described above.

Figure 8A:
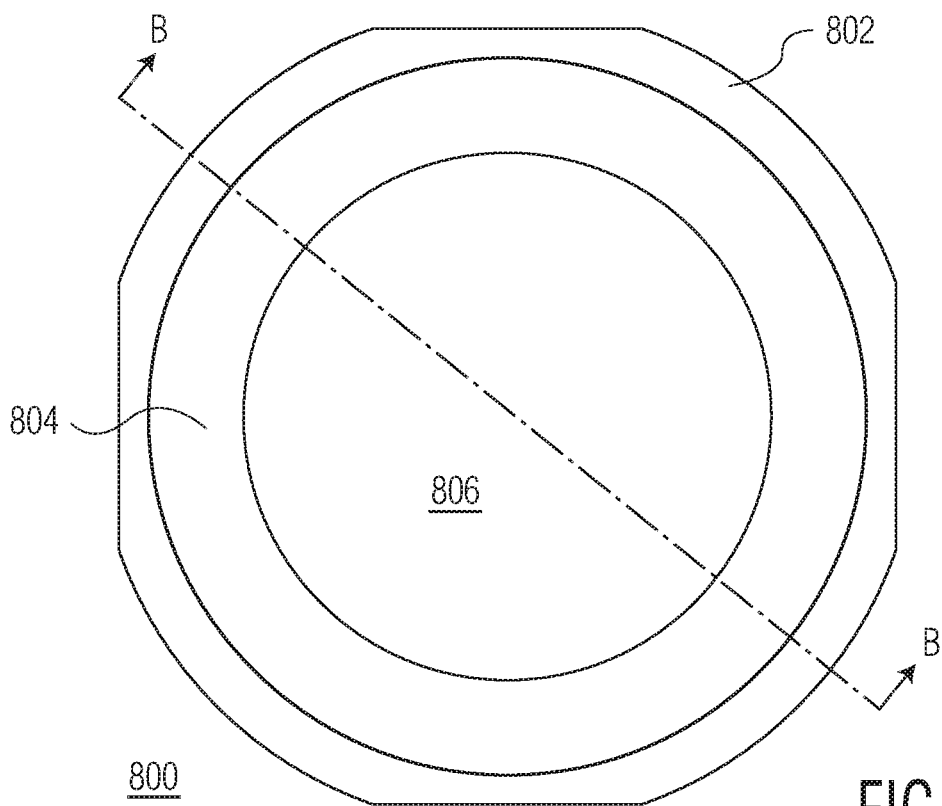
FIG. 8A and FIG. 8B illustrate, in simplified plan views, an example FFC frame having a diced wafer on a tape assembly in accordance with an embodiment.
Figure 8B:
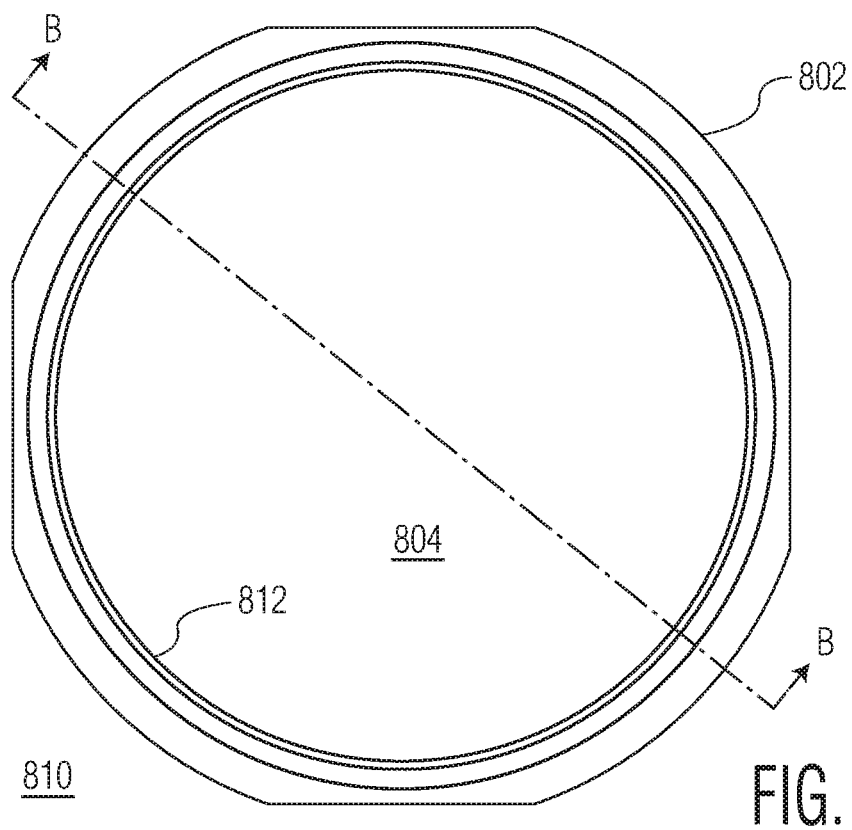

FIG. 8A and FIG. 8B illustrate, in simplified plan views, an example FFC 800 in accordance with an embodiment. The FFC 800 depicted in a top view, includes an FFC frame 802 with a diced wafer 806 affixed on a dicing tape 804. The FFC frame 802 having a central opening may be formed from a metal or plastic material and is configured to hold the dicing tape 804, but cannot be used to stretch the dicing tape 804 and fix the stretch on its own. In this embodiment, the central opening is configured as a substantially circular opening. The FFC 800 is depicted in a bottom view 810 of FIG. 8B which includes an example spring ring 812 engaged with the dicing tape 804 and the FFC frame 802. The diced wafer 806 on the dicing tape 804 forms an assembly secured to the FFC frame 802 by way of the spring ring 812. When the assembly is secured to the FFC frame 802, the dicing tape 804 is stretched laterally in all directions within the plane of the wafer, causing the saw bows to break and establishing physical separation between adjacent integrated circuits. Cross-sectional views taken along line B-B are depicted in FIG. 9A through FIG. 9D.

Figure 8C:
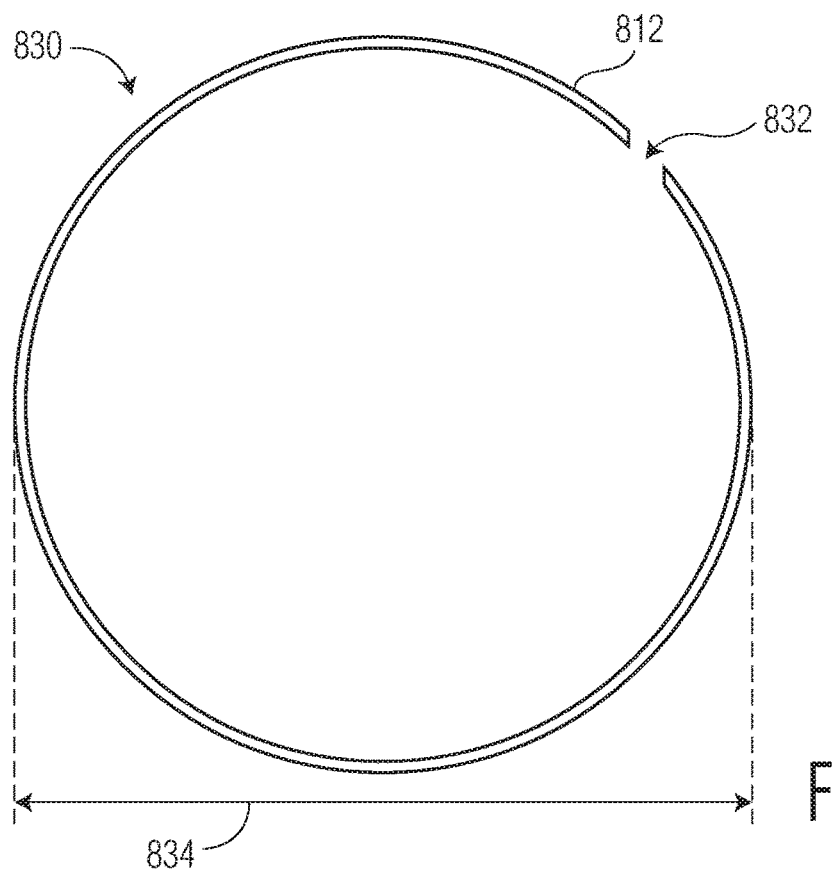
FIG. 8C and FIG. 8D illustrate, in simplified plan views, an example spring ring in accordance with an embodiment.
Figure 8D:
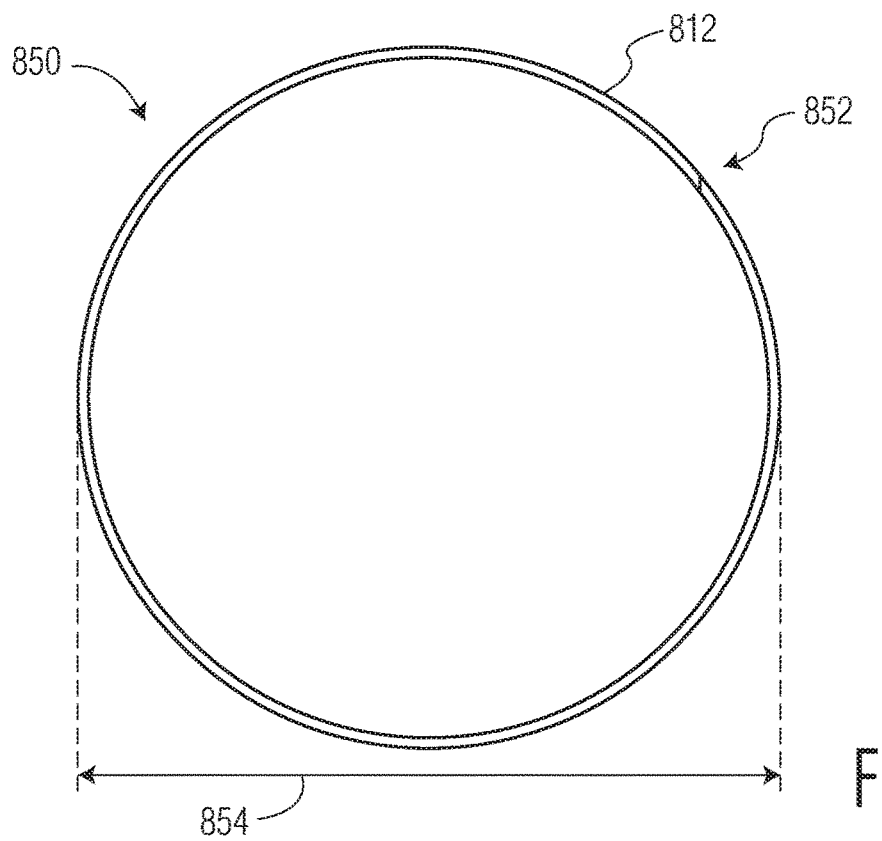

FIG. 8C and FIG. 8D illustrate, in simplified plan views, the example spring ring 812 in accordance with an embodiment. The spring ring 812 is depicted in an uncompressed (e.g., relaxed) spring form 830 of FIG. 8C with gap 832 formed between ends of the spring ring 812. The gap 832 as depicted in FIG. 8C is exaggerated for illustrative purposes. The uncompressed form 830 of spring ring 812 has an uncompressed outer diameter 834 as illustrated in FIG. 8C which is greater than a diameter of the central opening. The spring ring 812 is depicted in a compressed spring form 850 of FIG. 8D with substantially little or no gap 852 formed between ends of the spring ring 812. The compressed form 850 of spring ring 812 has a compressed outer diameter 854 as illustrated in FIG. 8D which is slightly less than the diameter of the central opening (e.g., diameter 930 in FIG. 9A) minus twice the thickness of the dicing tape 804. The spring ring 812 is formed in a substantially circular ring structure from a metal or plastic material, having an angular section removed (e.g., gap 832) to facilitate compression and relaxation of the spring ring 812. In other embodiments, the spring ring 812 may have other shapes and structure.

Figure 9A:
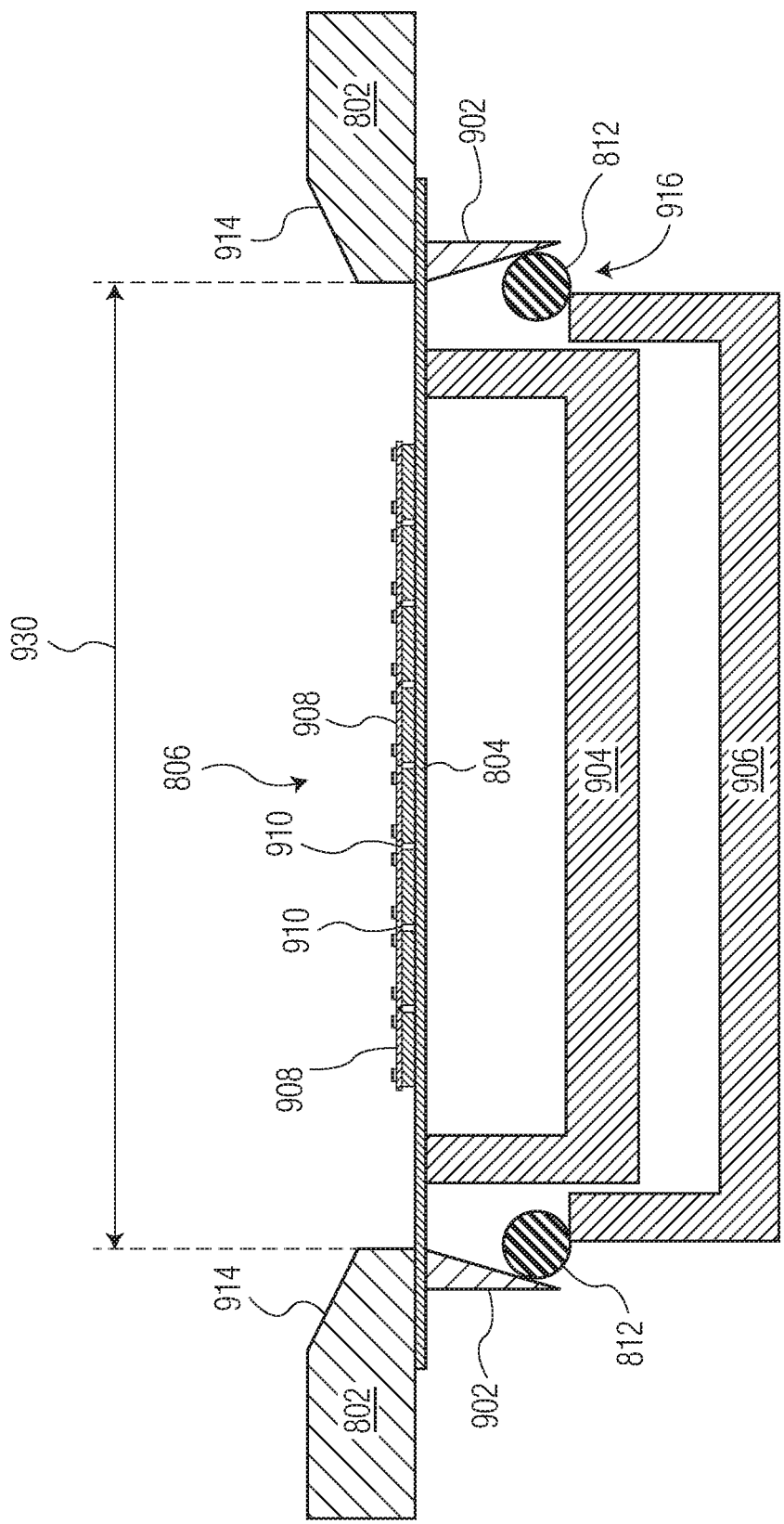

FIG. 9A illustrates, in a simplified cross-sectional side view taken along line B-B, an example stage of engaging the spring ring 812 with the FFC 800 in accordance with an embodiment. At this stage, the FFC 800 is positioned over an expansion tool 904, a pusher tool 906, a spring ring guide 902, and the spring ring 812. The FFC 800 includes the FFC frame 802 with the diced wafer 806 affixed on the dicing tape 804. The diced wafer 806 is shown as a plurality of integrated circuits 908 interconnected by saw bows 910 and supported by the dicing tape 804.

In this embodiment, an outer portion of the dicing tape 804 is affixed to a bottom surface of the FFC frame 802. An angled portion 914 (e.g., beveled edge) of the top surface at the central opening of the FFC frame 802 is configured for securing the dicing tape 804 with the spring ring 812. The central opening is configured having a substantially circular opening with a diameter 930. A spring channel 916 is formed between an inner angled side of the spring ring guide 902 and an outer side of the expansion tool 904. A leading edge of the expansion tool 904 which contacts the dicing tape 804 may be rounded or otherwise shaped to facilitate dicing tape expansion (e.g., stretching) without damaging the dicing tape. The spring ring 812 is in an uncompressed spring form positioned within the spring channel 916 at a leading edge of the pusher tool 906. In this embodiment, a substantially round cross-sectional shape of the spring ring 812 is depicted. In other embodiments, the spring ring 812 may have other cross-sectional shapes.

Figure 9B:
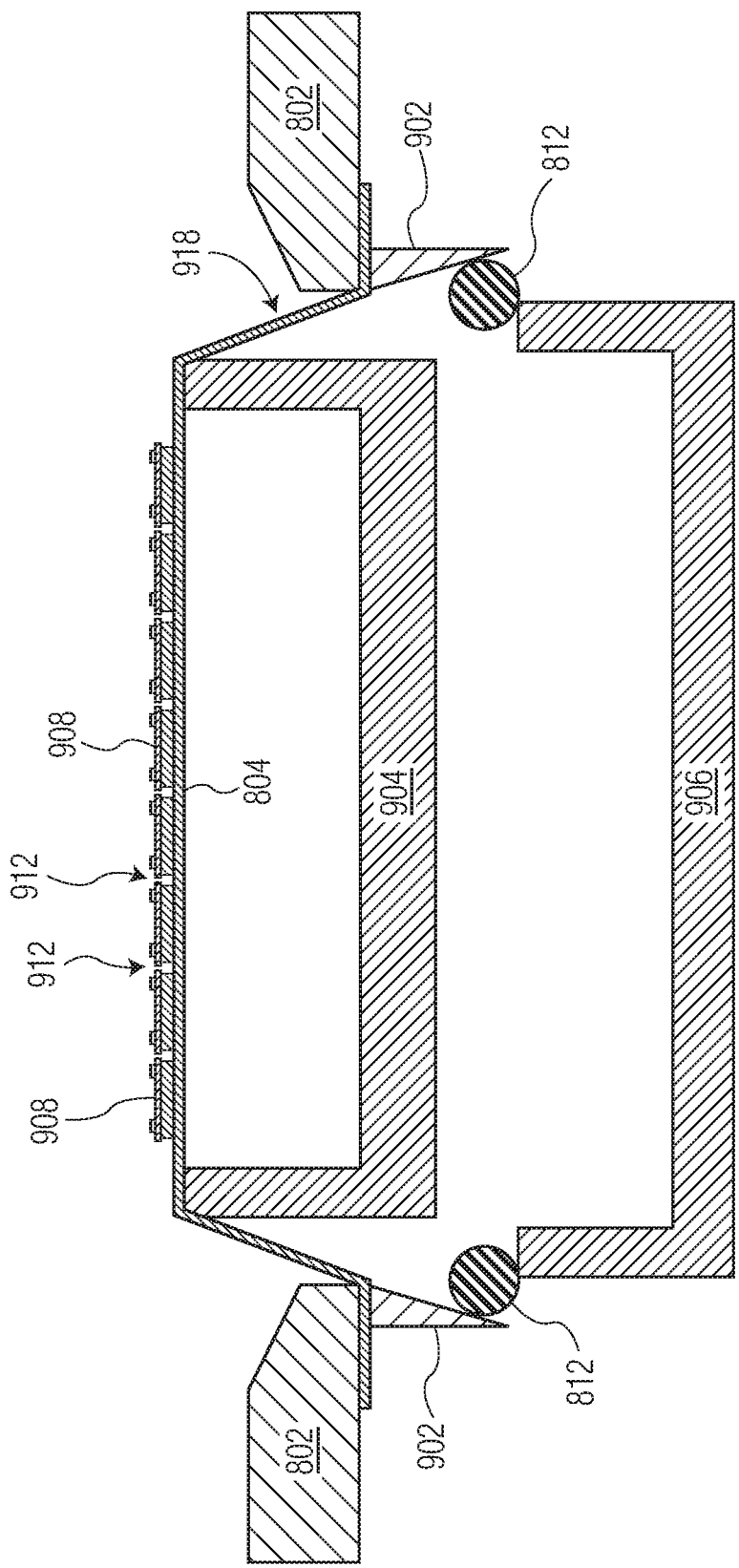

FIG. 9B illustrates, in a simplified cross-sectional side view taken along line B-B, a subsequent stage of engaging the spring ring 812 with the FFC 800 in accordance with an embodiment. At this stage, the expansion tool 904 is moved into an expansion position 918 causing the dicing tape 804 to stretch laterally within the plane of the integrated circuits 908, causing the saw bows to break and establishing physical separation 912 between adjacent integrated circuits. In this embodiment, the expansion tool 904 is engaged (e.g., contacted) with the dicing tape 804 and pushed up to the expansion position 918 to stretch the dicing tape 804 in at least two mutually orthogonal lateral directions to break the wafer saw bows holding the integrated circuits 908 together. The expansion position 918 may be characterized as a predetermined position suitable for a desired amount of stretch in the dicing tape 804, for example. The spring ring 812 remains in an uncompressed spring form positioned within the spring channel at the leading edge of the pusher tool 906.

FIG. 9C illustrates, in a simplified cross-sectional side view taken along line B-B, a subsequent stage of engaging the spring ring 812 with the FFC 800 in accordance with an embodiment. At this stage, the pusher tool 906 is positioned into a spring compression position 920 causing the spring ring 812 to be in the compressed spring form. In this embodiment, while the expansion tool 904 is at the expansion position (918), the pusher tool 906 is pushed up to the spring compression position 920 causing the spring ring 812 to compress. The spring compression position 920 may be characterized as a predetermined position suitable for compressing the spring ring 812 to a desired amount of compression or outer diameter, for example. When the spring ring 812 is in the compressed spring form, the outer diameter (854) spring ring 812 is configured to fit within the central opening diameter (930) of the FFC frame 802.

FIG. 9D illustrates, in a simplified cross-sectional side view taken along line B-B, a subsequent stage of engaging the spring ring 812 with the FFC 800 in accordance with an embodiment. At this stage, the expansion tool 904 is lowered and the spring ring 812 is located in a spring secured position 922 securing the stretched dicing tape 804. In this embodiment, with the expansion tool 904 lowered, the pusher tool 906 is pushed up further causing the compressed spring ring 812 to engage with the dicing tape 804. The pusher tool 906 is pushed up further yet until the spring ring 812 is engaged with the angled portion 914 of the FFC frame 802 by expanding into place at the spring secured position 922 as the spring ring 812 is uncompressed. When the spring ring 812 expands into place at the spring secured position 922, the spring ring is in an uncompressed form securing the stretched dicing tape 804 such that the physical separation 912 between adjacent integrated circuits 908 is maintained. With the spring ring 812 uncompressed at the spring secured position 922, the spring ring has an uncompressed outer diameter(854) larger than the diameter of the central opening (930), for example.

After the dicing tape 804 is secured by the spring ring 812 engaged at the spring secured position 922, the expansion tool 904 and the pusher tool 906 may be retracted. The FFC 800 with the spring ring 812 engaged allows the FFC 800 to be handled such that separated integrated circuits 908 can be safely stored and/or transported.

Although the present disclosure has been described in the context of FFCs in which that FFC frames have circular openings, in alternative embodiments, the FFC frames may have openings having a suitable shape other than circular (e.g., rectangular), as long as the rim or flexible pegs of the bottom FFC frame form an appropriate shape that stretches the dicing tape of the wafer/tape assembly in an appropriate manner. Note that, at a minimum, the circular or non-circular shape formed by the rim or flexible pegs should stretch the dicing tape in the mutually orthogonal directions corresponding to the rows and columns of IC dies on the diced wafer in order to break the saw bows 214 of FIG. 2A.

Although the present disclosure has been described in the context of FFCs in which barbed structures 334, 550, and 642 are used to hold the top and bottom FFC frames together, in alternative embodiments, other mechanisms are used to hold the top and bottom FFC frames together, such as clips or clamps that are applied around the periphery of the mated FFC frames. In some embodiments, the mated FFC frames may be held together by a friction fit between the top and bottom FFC frames and the intervening dicing tape 216 filling the gap (e.g., 340 of FIG. 4B) between the FFC frames.

According to certain embodiments, disclosed is an apparatus for retaining an integrated circuit/tape assembly comprising a plurality of integrated circuits supported by underlying dicing tape. The apparatus comprises (i) a top film frame carrier (FFC) frame having a central opening and (ii) a bottom FFC frame having structure, wherein, when the top and bottom FFC frames are mated together with the integrated circuit/tape assembly, the dicing tape is pulled over the structure thereby laterally stretching the dicing tape.

According to certain other embodiments, disclosed is a method for handling an integrated circuit/tape assembly comprising a plurality of integrated circuits supported by underlying dicing tape. The method comprises (i) placing the integrated circuit/tape assembly on a bottom FFC frame having structure; (ii) placing a top FFC frame having a central opening over the integrated circuit/tape assembly; and (iii) mating the top and bottom FFC frames such that the dicing tape is pulled over the structure thereby laterally stretching the dicing tape.

Generally, there is provided, an apparatus for retaining an integrated circuit tape assembly including a plurality of integrated circuits supported by an underlying dicing tape, the apparatus includes a film frame carrier (FFC) frame having a central opening; and a spring ring, the spring ring configured to expand when pushed into the dicing tape thereby securing the dicing tape. The central opening in the FFC frame may be a substantially circular opening that receives the integrated circuits of the integrated circuit tape assembly. The spring ring may have a substantially circular shape. The spring ring may be configured to have a first outer diameter when the spring ring is compressed and a second outer diameter when the spring ring is uncompressed, the second outer diameter larger than the first outer diameter. The outer diameter of the spring ring may be greater than the first outer diameter when the spring ring is securing the dicing tape. The FFC frame may further include an angled portion substantially surrounding the central opening. The angled portion of the FFC frame may be configured to engage an outer periphery of the spring ring to secure the dicing tape. The dicing tape may be stretched in at least two mutually orthogonal lateral directions to break wafer saw bows holding the integrated circuits together. The stretched dicing tape may increase distance between adjacent integrated circuits, thereby inhibiting the adjacent integrated circuits from colliding during shipment or storage.

In another embodiment, there is provided, an apparatus for retaining an integrated circuit tape assembly including a plurality of integrated circuits supported by an underlying dicing tape, the apparatus includes a film frame carrier (FFC) frame having a central opening; and a spring ring engaged with the dicing tape, the spring ring configured to expand from a compressed form when pushed into the dicing tape thereby securing the dicing tape. The FFC frame may further include an angled portion substantially surrounding the central opening. The angled portion of the FFC frame may be configured to engage an outer periphery of the spring ring to secure the dicing tape. The spring ring may be configured to have a first outer diameter when the spring ring is compressed and a second outer diameter when the spring ring is uncompressed, the second outer diameter larger than the first outer diameter. The outer diameter of the spring ring is greater than the first outer diameter when the dicing tape is secured by the spring ring. The dicing tape may be stretched in at least two mutually orthogonal lateral directions to break wafer saw bows holding the integrated circuits together and increase distance between adjacent integrated circuits.

In yet another embodiment, there is provided, a method for handling an integrated circuit tape assembly including a plurality of integrated circuits supported by an underlying dicing tape, the method includes placing the integrated circuit tape assembly on a film frame carrier (FFC) frame having a central opening; stretching the dicing tape while on the FFC frame; and securing the stretched dicing tape by engaging a spring ring with the dicing tape and FFC frame. The stretching the dicing tape may include stretching the dicing tape in at least two mutually orthogonal lateral directions to break wafer saw bows holding the integrated circuits together. The securing the stretched dicing tape may further include compressing the spring ring before engaging the spring ring with the dicing tape and FFC frame. The securing the stretched dicing tape may further include allowing the spring ring to expand when engaging with the dicing tape and FFC frame, the spring ring having a diameter greater than a diameter of the central opening when the spring ring is expanded. The stretching the dicing tape while on the FFC frame may further include engaging a tool to stretch the dicing tape, the tool remaining engaged while engaging the spring ring to secure the stretched dicing tape.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this disclosure may be made by those skilled in the art without departing from embodiments of the disclosure encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the disclosure.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. An apparatus for retaining an integrated circuit tape assembly comprising a plurality of integrated circuits supported by an underlying dicing tape, the apparatus comprising:
    a film frame carrier (FFC) frame having a central opening and an angled portion substantially surrounding the central opening; and
    a spring ring configured to expand when pushed into the dicing tape thereby securing the dicing tape, the angled portion of the FFC frame configured to engage an outer periphery of the spring ring to secure the dicing tape.

2. The apparatus of claim 1, wherein the central opening in the FFC frame is a substantially circular opening that receives the integrated circuits of the integrated circuit tape assembly.

3. The apparatus of claim 1, wherein the spring ring has a substantially circular shape.

4. The apparatus of claim 1, wherein the spring ring is configured to have a first outer diameter when the spring ring is compressed and a second outer diameter when the spring ring is uncompressed, the second outer diameter larger than the first outer diameter.

5. The apparatus of claim 4, wherein the outer diameter of the spring ring is greater than the first outer diameter when the spring ring is securing the dicing tape.

6. The apparatus of claim 1, wherein the dicing tape is stretched in at least two mutually orthogonal lateral directions to break wafer saw bows holding the integrated circuits together.

7. The apparatus of claim 6, wherein the stretched dicing tape increases distance between adjacent integrated circuits, thereby inhibiting the adjacent integrated circuits from colliding during shipment or storage.

8. An apparatus for retaining an integrated circuit tape assembly comprising a plurality of integrated circuits supported by an underlying dicing tape, the apparatus comprising:
    a film frame carrier (FFC) frame having a central opening and an angled portion substantially surrounding the central opening; and a spring ring engaged with the dicing tape, the spring ring configured to expand from a compressed form when pushed into the dicing tape thereby securing the dicing tape, the angled portion of the FFC frame configured to engage an outer periphery of the spring ring to secure the dicing tape.

9. The apparatus of claim 8, wherein the spring ring is configured to have a first outer diameter when the spring ring is compressed and a second outer diameter when the spring ring is uncompressed, the second outer diameter larger than the first outer diameter.

10. The apparatus of claim 9, wherein the outer diameter of the spring ring is greater than the first outer diameter when the dicing tape is secured by the spring ring.

11. The apparatus of claim 8, wherein the dicing tape is stretched in at least two mutually orthogonal lateral directions to break wafer saw bows holding the integrated circuits together and increase distance between adjacent integrated circuits.

* * * * *